(12) United States Patent
Wang et al.

(10) Patent No.: US 9,443,577 B2
(45) Date of Patent: Sep. 13, 2016

(54) VOLTAGE-SWITCHED MAGNETIC RANDOM ACCESS MEMORY (MRAM) AND METHOD FOR USING THE SAME

(71) Applicant: Avalanche Technology Inc., Fremont, CA (US)

(72) Inventors: Zihui Wang, Milpitas, CA (US); Xiaobin Wang, Fremont, CA (US); Huadong Gan, Fremont, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/281,673

(22) Filed: May 19, 2014

(65) Prior Publication Data

US 2015/0332748 A1    Nov. 19, 2015

(51) Int. Cl.
| | | |
|---|---|---|
| *H01L 29/82* | (2006.01) | |
| *G11C 11/56* | (2006.01) | |
| *H01L 43/08* | (2006.01) | |
| *G11C 11/16* | (2006.01) | |

(52) U.S. Cl.
CPC .......... *G11C 11/5607* (2013.01); *G11C 11/161* (2013.01); *G11C 11/165* (2013.01); *H01L 43/08* (2013.01)

(58) Field of Classification Search
CPC .... G11C 11/161; G11C 11/165; H01L 43/08
USPC ......................................................... 365/158
See application file for complete search history.

(56) References Cited

U.S. PATENT DOCUMENTS

| | | | | |
|---|---|---|---|---|
| 7,889,543 B2* | 2/2011 | Morise et al. | ................ | 365/158 |
| 8,508,984 B2* | 8/2013 | Ranjan et al. | ................ | 365/158 |
| 8,860,156 B2* | 10/2014 | Beach | ................ | H01L 29/82 |
| | | | | 257/421 |
| 8,988,934 B2* | 3/2015 | Shukh | ................ | H01L 29/82 |
| | | | | 365/148 |
| 2008/0164548 A1* | 7/2008 | Ranjan et al. | ................ | 257/421 |
| 2009/0213638 A1* | 8/2009 | Morise et al. | ................ | 365/145 |
| 2011/0031569 A1* | 2/2011 | Watts | ................ | B82Y 25/00 |
| | | | | 257/421 |
| 2013/0286723 A1* | 10/2013 | Zhou | ................ | H01L 43/02 |
| | | | | 365/158 |

(Continued)

OTHER PUBLICATIONS

Wang et al.,"Electric-field-assisted switching in magnetic tunnel junctions," Nature Materials, Nov. 13, 2011, pp. 1-5 (Advance Online Publication: www.nature.com/naturematerials).

*Primary Examiner* — Pho M Luu
*Assistant Examiner* — Xiaochun L Chen
(74) *Attorney, Agent, or Firm* — Bing K. Yen

(57) ABSTRACT

The present invention is directed to a magnetic random access memory comprising a first magnetic tunnel junction (MTJ) including a first magnetic reference layer and a first magnetic free layer with a first insulating tunnel junction layer interposed therebetween; a second MTJ including a second magnetic reference layer and a second magnetic free layer with a second insulating tunnel junction layer interposed therebetween; and an anti-ferromagnetic coupling layer formed between the first and second variable magnetic free layers. The first and second magnetic free layers have a first and second magnetization directions, respectively, that are perpendicular to the layer planes thereof. The first magnetic reference layer has a first pseudo-fixed magnetization direction substantially perpendicular to the layer plane thereof. The second magnetic reference layer has a second pseudo-fixed magnetization direction that is substantially perpendicular to the layer plane thereof and is substantially opposite to the first pseudo-fixed magnetization direction.

16 Claims, 5 Drawing Sheets

(56) References Cited

U.S. PATENT DOCUMENTS

| | | | |
|---|---|---|---|
| 2014/0070341 A1* | 3/2014 | Beach | H01L 29/82 257/421 |
| 2014/0103470 A1* | 4/2014 | Shukh | H01L 29/82 257/421 |
| 2015/0001656 A1* | 1/2015 | Beach | H01L 29/82 257/421 |
| 2015/0091110 A1* | 4/2015 | Kuo | H01L 43/08 257/421 |

* cited by examiner

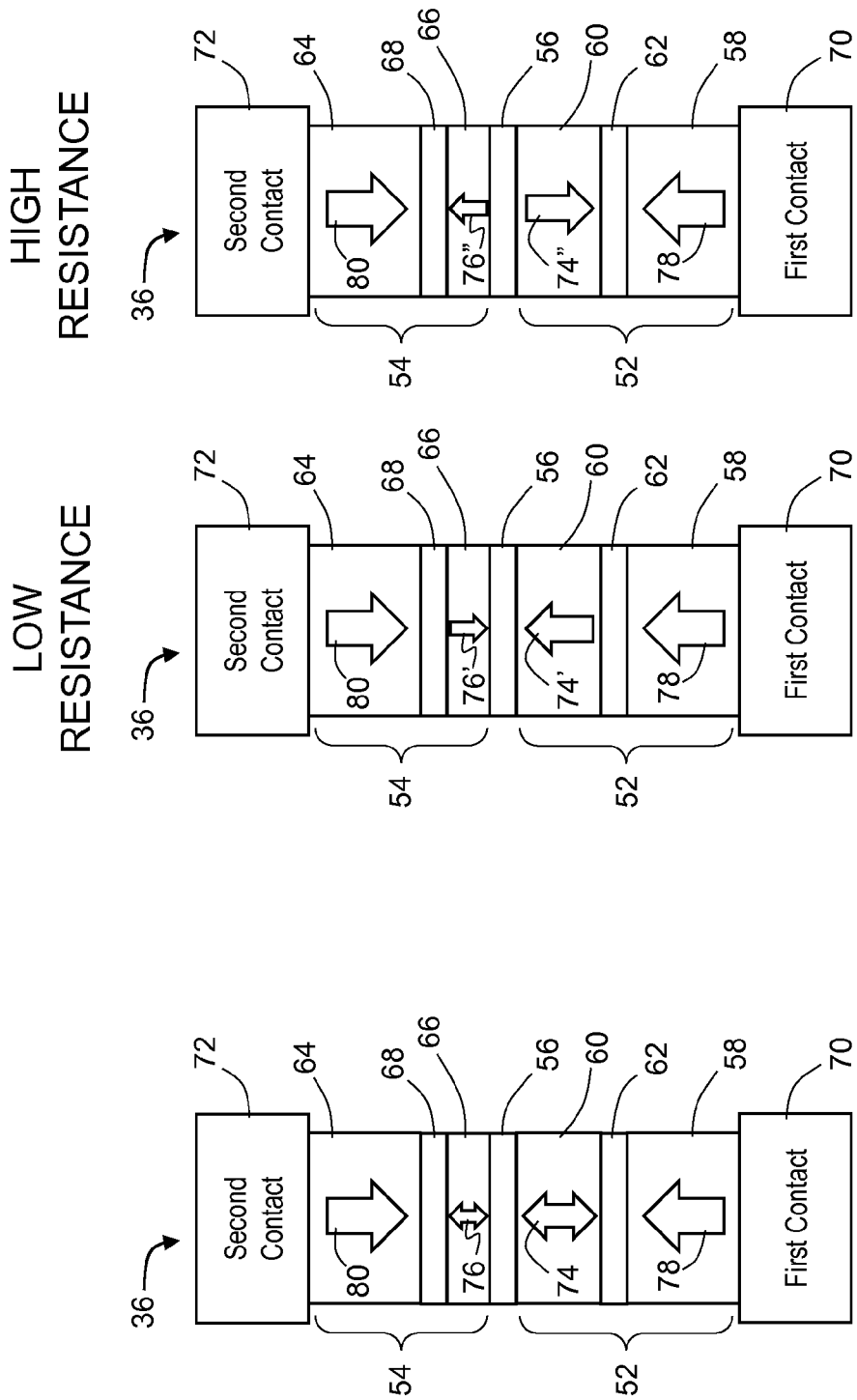

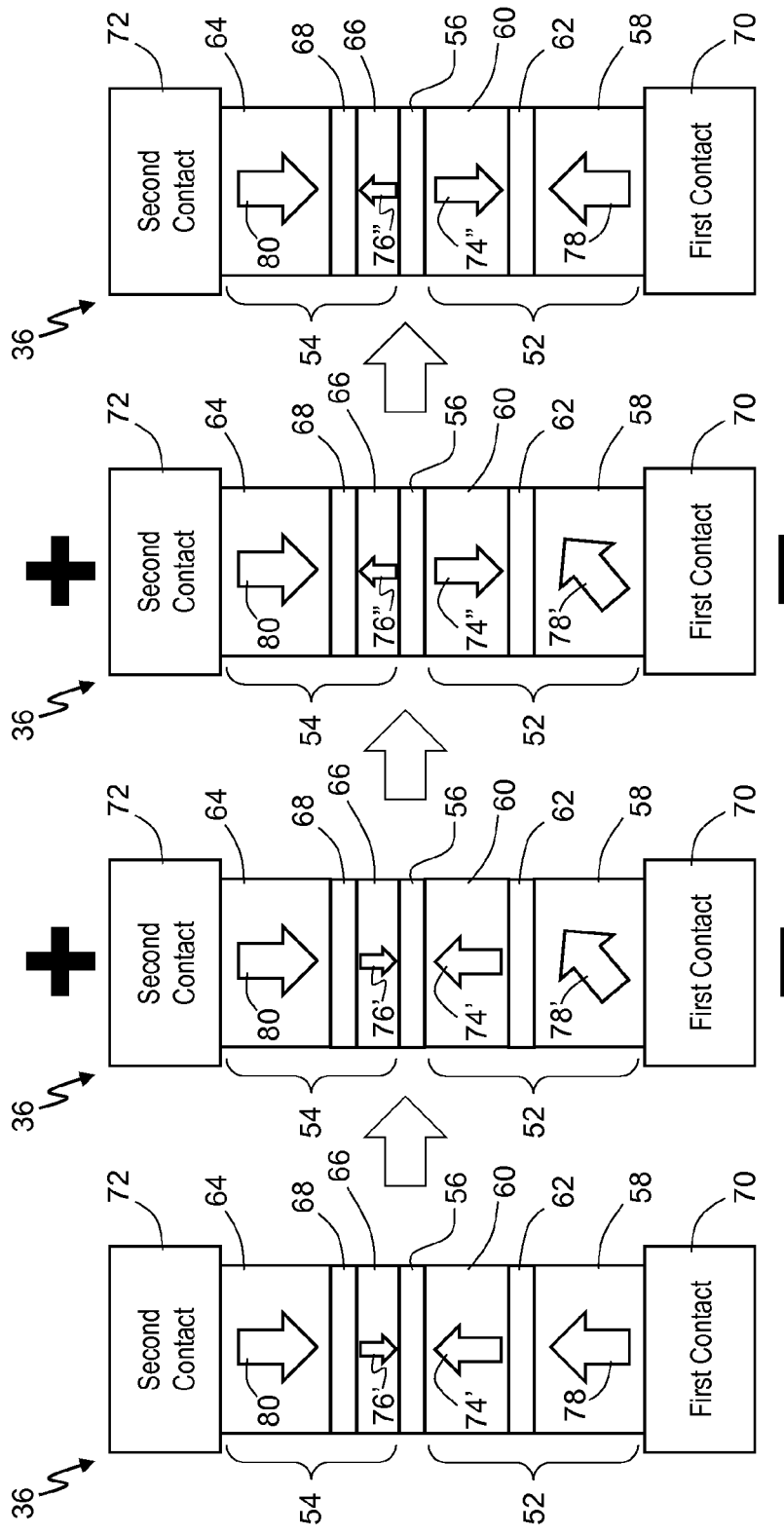

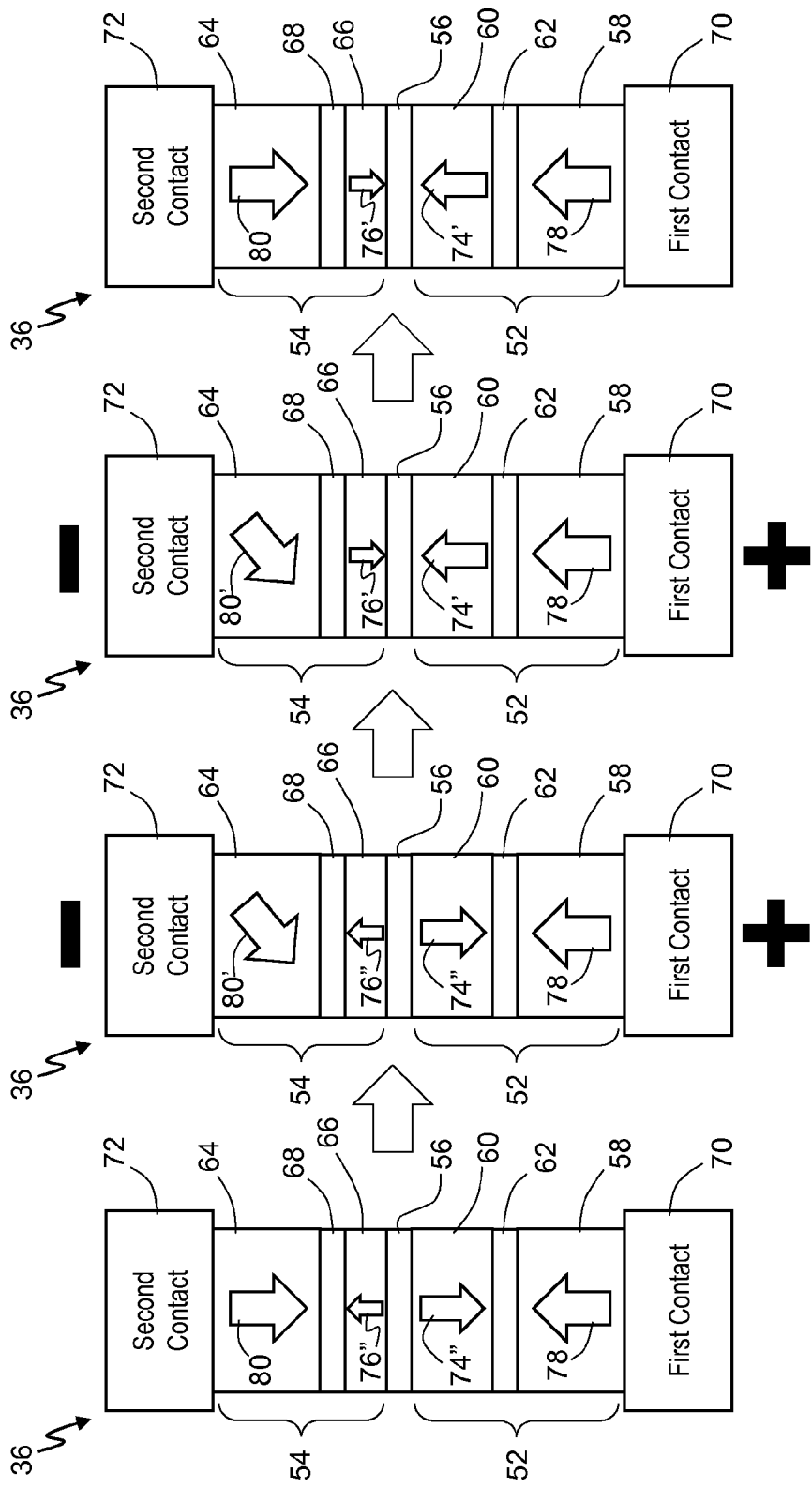

VOLTAGE-SWITCHED MAGNETIC RANDOM ACCESS MEMORY (MRAM) AND METHOD FOR USING THE SAME

BACKGROUND

The present invention relates to a magnetic random access memory (MRAM) device, and more particularly, to an MRAM element that can be switched by voltage and a method for using the same.

Magnetic random access memory (MRAM) is a new class of non-volatile memory, which can retain the stored information when powered off. An MRAM device normally comprises an array of memory cells, each of which includes at least a magnetic memory element and a selection transistor coupled in series between appropriate electrodes. Upon application of a switching current or magnetic field to the magnetic memory element, the electrical resistance of the magnetic memory element would change, thereby switching the stored logic in the respective memory cell.

FIG. 1 shows a conventional MRAM element comprising a magnetic reference layer 12 and a magnetic free layer 14 with an insulating tunnel junction layer 16 interposed therebetween. The magnetic reference layer 12, the insulating tunnel junction layer 16, and the magnetic free layer 14 collectively form a magnetic tunneling junction (MTJ) 18. The magnetic reference layer 12 and free layer 14 have magnetization directions 20 and 22, respectively, which are substantially perpendicular to the respective layer planes. Therefore, the MTJ 18 is a perpendicular type comprising the magnetic layers 12 and 14 with perpendicular anisotropy. The magnetization direction 22 of the magnetic free layer 14 can be switched between two directions: parallel and antiparallel with respect to the magnetization direction 20 of the magnetic reference layer 12. The insulating tunnel junction layer 16 is normally made of an insulating material with a thickness ranging from a few to a few tens of angstroms. However, when the magnetization directions 22 and 20 of the magnetic free layer 14 and reference layer 12 are substantially parallel, electrons polarized by the magnetic reference layer 12 can tunnel through the insulating tunnel junction layer 16, thereby decreasing the electrical resistivity of the perpendicular MTJ 18. Conversely, the electrical resistivity of the perpendicular MTJ 18 is high when the magnetization directions 20 and 22 of the magnetic reference layer 12 and free layer 14 are substantially anti-parallel. Accordingly, the stored logic in the magnetic memory element can be switched by changing the magnetization direction 22 of the magnetic free layer 14.

There are several ways to switch the magnetization direction 22 of the magnetic free layer 14 in MRAM devices. In a field-toggle MRAM device, the magnetization direction 22 of the magnetic free layer 14 is switched by a magnetic field induced by a "write" word line. The field-toggle MRAM requires the extra write word line circuitry and a substantially large current to generate the magnetic field for switching, thereby rendering it impractical for high density memory applications. In a spin transfer torque MRAM device, the magnetization direction 22 of the magnetic free layer 14 is switched by a spin polarized current, thereby eliminating the need for the write word line circuitry. However, the switching current of the spin transfer torque MRAM may still be too high to prevent the miniaturization of the selection transistor and hence the memory cell. Moreover, the spin transfer torque MRAM requires lower memory resistance because of the high switching current passing therethrough, thereby necessitating the insulating tunnel junction layer 16 to be thinner and less reliable.

A recent study by Wang et al. on perpendicular MTJ shows that the perpendicular anisotropy of magnetic layers in magnesium oxide (MgO) based MTJ structures can be changed by the voltage applied to the magnetic layers. See Wei-Gang Wang et al., "Electric-field-assisted switching in magnetic tunnel junctions," Nature Materials Vol. 11, 64-68 (2012).

In the test set-up of Wang et al. as shown in FIG. 1, a positive electric potential is applied to the MTJ 18 to drive electrons into the magnetic free layer 14 made of 1.6 nm thick $Co_{40}Fe_{40}B_{20}$. When the insulating tunnel junction layer 16, which is made of 1.4 nm thick magnesium oxide (MgO), is sufficiently thick and the electrical resistance across the MgO junction layer 16 is sufficiently high, the current density through the MgO junction layer 16 will be low. In this case, the magnetic reference layer 12, which is made of 1.3 nm thick $Co_{40}Fe_{40}B_{20}$, and the magnetic free layer 14 adjacent to the MgO junction layer 16 effectively form a parallel plate capacitor with the MgO junction layer 16 acts as the dielectric. When a voltage is applied to the MTJ 18, electrical charges will accumulate in the two magnetic layers 12 and 14 like a capacitor, resulting in formation of an electric field 24 across the MgO junction layer 16. The applied positive voltage as shown in FIG. 1 causes the magnetic free layer 14 to have a negative potential, i.e. electron accumulation at the interface between the magnetic free layer 14 and the MgO junction layer 16. With increasing applied voltage and electron accumulation at the interface, the magnetic free layer 14 shows decreasing perpendicular anisotropy, which is reflected by decreasing coercivity field Hc. The decreasing of perpendicular anisotropy and corresponding coercivity field would facilitate the switching of the variable magnetization direction 22 of the magnetic free layer 14 from parallel to anti-parallel orientation. In contrast, electrons will be depleted at the interface between the magnetic reference layer 12 and the MgO junction layer 16 with increasing applied voltage, resulting in increasing perpendicular anisotropy and coercivity field for the magnetic reference layer 12. It should be noted that Wang's finding can only be used to help switching the variable magnetic moment 22 of the magnetic free layer 14 from parallel to anti-parallel orientation, not the other way, i.e. anti-parallel to parallel orientation.

A possible explanation for the observed changes in perpendicular anisotropy with electron accumulation/depletion at interfaces between the magnetic free layer/MgO junction layer/magnetic reference layer as reported by Wang et al. may be that having increased amount of electrons at the interface between the magnetic free layer 14 and the MgO junction layer 16 allows more conductive electrons to fill the 3d-band of CoFe lattice and reduce the unpaired 3d-valence electron population, thereby making the broken-symmetry induced surface perpendicular anisotropy weaker and the magnetic free layer 14 magnetically softer. When 3d-electrons are depleted at the interface between the magnetic reference layer 12 and the MgO junction layer 16, electrons will be depleted first from paired 3d-electrons according to Hunt's Rules. As more 3d-electrons become unpaired in the magnetic reference layer 12, the surface perpendicular anisotropy thereof increases, making the magnetic reference layer 12 magnetically harder to switch by external field or spin transfer torque.

While a conventional MTJ having an MgO junction layer can exhibit the above-described electric field assisted switching effect, the effect is not significant because the MgO junction layer is thin enough to allow a relatively high density of electrons to tunnel therethrough, thereby minimizing the capacitive effect needed to generate electrons at the interface between the magnetic layer and the MgO junction layer. Increasing the MgO thickness can improve the capacitive effect and the tunneling magnetoresistance (TMR) but would also adversely increase the MTJ resistance, thereby increasing the power consumption. Moreover, the prior art method illustrated in FIG. 1 does not completely eliminate the need for a switching current and can only help switching a magnetic free layer from parallel to anti-parallel orientation, i.e. low resistance to high resistance state.

For the foregoing reasons, there is a need for an MRAM device having MTJ memory elements that can be easily switched and a method for switching the memory elements between low and high resistance state.

SUMMARY

The present invention is directed to an MRAM device that satisfies this need. An MRAM element having features of the present invention comprises a first magnetic tunnel junction (MTJ) including a first magnetic reference layer and a first magnetic free layer with a first insulating tunnel junction layer interposed therebetween; a second MTJ including a second magnetic reference layer and a second magnetic free layer with a second insulating tunnel junction layer interposed therebetween; and an anti-ferromagnetic coupling layer formed between the first and second magnetic free layers. The first and second magnetic free layers have a first and second variable magnetization directions, respectively, that are opposite to each other and are perpendicular to the respective layer planes. The first magnetic reference layer has a first pseudo-fixed magnetization direction substantially perpendicular to the layer plane thereof. The second magnetic reference layer has a second pseudo-fixed magnetization direction that is substantially perpendicular to the layer plane thereof and is substantially opposite to the first pseudo-fixed magnetization direction. In an embodiment, the first magnetic free layer has a higher magnetic moment than the second magnetic free layer. The MRAM element may optionally include a first and second contacts electrically connected to the first and second magnetic reference layers, respectively.

According to another aspect of the present invention, a method for switching the MRAM element from low to high resistance state comprises the steps of applying an electric potential with a positive terminal electrically connected to the second contact and a negative terminal electrically connected to the first contact to partially rotate the first pseudo-fixed magnetization direction, thereby allowing the first and second variable magnetization directions to switch from parallel to anti-parallel orientation with respect to the first and second pseudo-fixed magnetization directions; and removing the electric potential to allow the first pseudo-fixed magnetization direction to rotate back.

According to still another aspect of the present invention, a method for switching the MRAM element from high to low resistance state comprises the steps of applying an electric potential with a positive terminal electrically connected to the first contact and a negative terminal electrically connected to the second contact to partially rotate the second pseudo-fixed magnetization direction, thereby allowing the first and second variable magnetization directions to switch from anti-parallel to parallel orientation with respect to the first and second pseudo-fixed magnetization directions; and removing the electric potential to allow the second pseudo-fixed magnetization direction to rotate back.

BRIEF DESCRIPTION OF THE DRAWINGS

These and other features, aspects, and advantages of the present invention will become better understood with regard to the following description, appended claims, and accompanying drawings where:

FIG. 3 is a cross sectional view of a memory element according to an embodiment of the present invention;

FIGS. 4A and 4B are cross sectional views of a memory element in low and high resistance state, respectively, according to the present invention;

FIGS. 5A-5D illustrate stages of magnetization configuration for a memory element during switching from low to high resistance state according to a method embodiment of the present invention; and FIGS. 6A-6D illustrate stages of magnetization configuration for a memory element during switching from high to low resistance state according to another method embodiment of the present invention.

For purposes of clarity and brevity, like elements and components will bear the same designations and numbering throughout the Figures, which are not necessarily drawn to scale.

DETAILED DESCRIPTION

Figure 1:
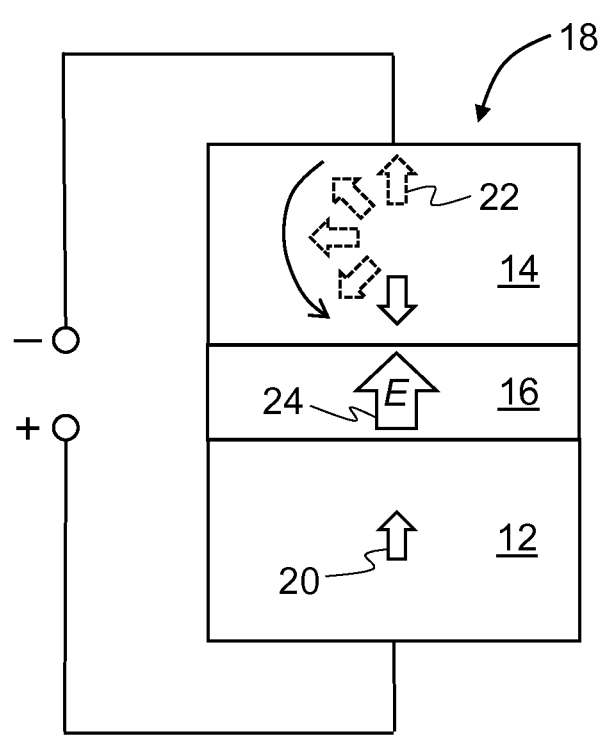
FIG. 1 illustrates a conventional perpendicular magnetic tunnel junction with a potential applied thereto.

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure of layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a $[Co/Pt]_n$ superlattice would denote a structure formed by n stacks of bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 2:
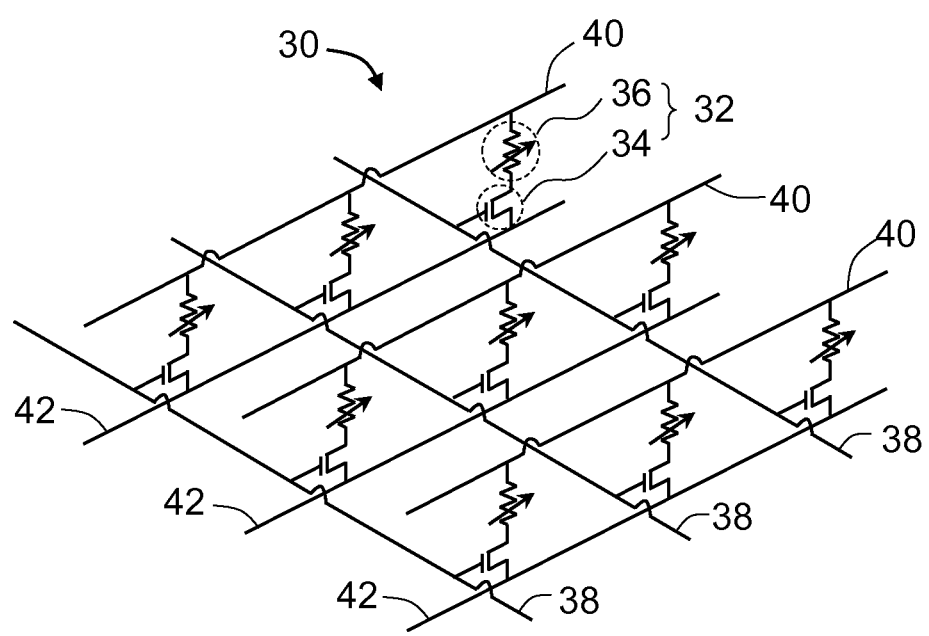
FIG. 2 is a schematic view of a circuit diagram of an MRAM device according to an embodiment of the present invention.

FIG. 2 is a schematic circuit diagram for an MRAM device 30 according to an embodiment of the present invention. The MRAM device 30 comprises a plurality of memory cells 32, each of the memory cells 32 including a selection transistor 34 coupled to a MTJ memory element 36; a plurality of parallel word lines 38 with each being coupled to a respective row of the selection transistors 34 in a first direction; and a plurality of parallel bit lines 40 with each being coupled to a respective row of the memory elements 36 in a second direction perpendicular to the first direction; and optionally a plurality of parallel source lines 42 with each being coupled to a respective row of the selection transistors 34 in the first or second direction.

An embodiment of the present invention as applied to the perpendicular MTJ memory element 36 will now be described with reference to FIG. 3. Referring now to FIG. 3, the illustrated memory element 36 comprises a first MTJ 52 exchanged coupled to a second MTJ 54 through an anti-ferromagnetic coupling layer 56. The first MTJ 52 includes a first magnetic reference layer 58 and a first magnetic free layer 60 with a first insulating tunnel junction layer 62 interposed therebetween. The second MTJ 54 includes a second magnetic reference layer 64 and a second magnetic free layer 66 with a second insulating tunnel junction layer 68 interposed therebetween. The anti-ferromagnetic coupling layer 56 is formed adjacent to the first magnetic free layer 60 and the second magnetic free layer 66 and provides anti-ferromagnetic coupling therebetween. The first magnetic free layer 60 may have a higher magnetic moment than the second magnetic free layer 66.

The memory element 36 may optionally include a first contact 70 electrically connected to the first magnetic reference layer 58 and a second contact 72 electrically connected to the second magnetic reference layer 64. The first contact 70 may be in direct contact with the first magnetic reference layer 58 or alternatively at least one magnetic or non-magnetic layer may interpose therebetween. Similarly, the second contact 72 may be in direct contact with the second magnetic reference layer 64 or at least one magnetic or non-magnetic layer may interpose therebetween. In an embodiment, an anti-ferromagnetic (AFM) layer (not shown) is formed between the first magnetic reference layer 58 and the first contact 70 to "pin" the magnetization direction of the first magnetic reference layer 58. Similarly, another AFM layer (not shown) may also be formed between the second magnetic reference layer 64 and the second contact 72. The stacking order of the layers 56-72 of the memory element 36 may be inverted without affecting the memory performance. Therefore, the first contact 70 or the second contact 72 of the memory element 36 may be coupled to a selection transistor 34 or to one of the parallel bit lines 40 as shown in FIG. 2.

With continuing reference to FIG. 3, the first magnetic free layer 60 has a first variable magnetization direction 74 substantially perpendicular to the layer plane thereof. The second magnetic free layer 66, which is anti-ferromagnetically coupled to the first magnetic free layer 60, has a second variable magnetization direction 76 that is substantially perpendicular to the layer plane thereof and is substantially opposite to the first variable magnetization direction 74. The first magnetic reference layer 58 has a first pseudo-fixed magnetization direction 78 that is substantially perpendicular to the layer plane thereof. The second magnetic reference layer 64 has a second pseudo-fixed magnetization direction 80 that is substantially perpendicular to the layer plane thereof and is substantially opposite to the first pseudo-fixed magnetization direction 78. Unlike the fixed magnetization direction associated with the reference layer of the field-toggle MRAM or the spin transfer torque MRAM, the first and second pseudo-fixed magnetization directions 78 and 80 remain fixed during read operation but may temporarily tilt or rotate away from the respective vertical positions without switching to the opposite directions during write operation as will be explained later.

The first and second magnetic free layers 60 and 66 each may comprise one or more ferromagnetic elements, such as but not limited to cobalt (Co), nickel (Ni), and iron (Fe), to form a magnetic material, such as but not limited to Co, Ni, Fe, CoNi, CoFe, NiFe, or CoNiFe. The magnetic material of each of the magnetic free layers 60 and 66 may optionally include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), and phosphorus (P), to form a magnetic alloy or compound, such as but not limited to cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), or cobalt-iron-phosphorous (CoFeP). In an embodiment, the first and second magnetic free layers 60 and 66 each is made of an alloy comprising Co, Fe, and B.

Alternatively, the first and second magnetic free layers 60 and 66 each may comprise at least two magnetic sublayers with each of the magnetic sublayers made of a suitable magnetic free layer material as described above. The magnetic free layers 60 and 66 each may further comprise at least one insertion or perpendicular enhancement layer (PEL) made of a suitable non-magnetic material, such as but not limited to Ta, W, and Ru, between the magnetic sublayers. In an embodiment, the first and second magnetic free layers 60 and 66 each may comprise two magnetic sublayers with a Ta perpendicular enhancement layer (PEL) interposed therebetween.

Still alternatively, the first and second magnetic free layers 60 and 66 each may have a multilayer structure formed by interleaving at least two different types of materials with at least one of the at least two different types of materials being magnetic, such as but not limited to [Co/Pt]$_n$, [Co/Pd]$_n$, [Co/Ni]$_n$, [CoFe/Pt]$_n$, or [Co/Pt(Pd)]$_n$. The multilayer structure of each of the first and second magnetic free layers 60 and 66 may or may not exhibit the characteristic satellite peaks associated with superlattice when analyzed by X-ray or neutron diffraction.

The first and second magnetic reference layers 58 and 64 each may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of each of the first and second magnetic reference layers 58 and 64 may optionally include at least one non-magnetic element, such as but not limited to samarium (Sm), neodymium (Nd), B, Ti, Zr, Hf, V, Nb, Ta, Cr, Mo, W, Al, Si, Ge, Ga, O, N, C, Pt, Pd, or P, to form a magnetic alloy or compound, such as but not limited to SmCo, NdFeB, FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa. In an embodiment, the first and second magnetic reference layers 58 and 64 each is made of an alloy comprising Co, Fe, and B.

Alternatively, the first and second magnetic reference layers 58 and 64 each may comprise at least two magnetic sublayers with each of the magnetic sublayers made of a suitable magnetic reference layer material as described above. The magnetic reference layers 58 and 64 each may further comprise at least one insertion or perpendicular enhancement layer (PEL) made of a suitable non-magnetic material, such as but not limited to Ta, W, and Ru, between the magnetic sublayers. In an embodiment, the first and second magnetic reference layers 58 and 64 each may comprise two magnetic sublayers with a Ta perpendicular enhancement layer (PEL) interposed therebetween.

Still alternatively, the first and second magnetic reference layers 58 and 64 each may have a multilayer structure formed by interleaving at least two different types of materials with at least one of the at least two different types of materials being magnetic, such as but not limited to [Co/Pt]$_n$, [Co/Pd]$_n$, [Co/Ni]$_n$, [CoFe/Pt]$_n$, or [Co/Pt(Pd)]$_n$. The multilayer structure of each of the first and second magnetic reference layers 58 and 64 may or may not exhibit the characteristic satellite peaks associated with superlattice when analyzed by X-ray or neutron diffraction.

The first and second insulating tunnel junction layers 62 and 68, which have an energy barrier through which electrons can pass by tunnel effect, each may be made of any suitable insulating material, such as but not limited to magnesium oxide (MgO) and aluminum oxide (AlOx). The first and second insulating tunnel junction layers 62 and 68 preferably have relatively higher RA (product of resistance and cross sectional area) values in the range of about 20 to 2000 $\Omega \cdot \mu m^2$ to minimize the spin transfer torque switching effect and enhance the voltage-induced anisotropy change.

The anti-ferromagnetic coupling layer 56, through which the first and second magnetic free layers 60 and 66 are exchange coupled, may be made of a material comprising at least one element selected from the group consisting of ruthenium (Ru), rhodium (Rh), iridium (Ir), tantalum (Ta), manganese (Mn), oxygen (O), and nitrogen (N). In an embodiment, the anti-ferromagnetic coupling layer is made of Ru or Ta.

The optional first and second contacts 70 and 72 are non-magnetic and each may comprise one or more metallic elements selected from the group consisting of Ti, Zr, Hf, V, Nb, Ta, Cr, Mo, W, Pd, Pt, Co, Ni, Fe, Rh, Ru, Cu, and Ag. Each of the first and second contacts 70 and 72 may further include at least one non-magnetic element selected from the group consisting of O, N, C and Si, to form an alloy or compound, such as but not limited to TiOx, TiN, TiC, TiSx, ZrOx, ZrN, HfOx, VN, VC, NbN, NbC, TaN, TaC, CrOx, MoOx, WOx, CoOx, or NiOx. Moreover, each of the first and second contacts 70 and 72 may contain one or more magnetic elements, such as Co, Ni, and Fe, at a concentration that is below the threshold required for becoming magnetized. In an embodiment, each of the first and second contacts 70 and 72 is made of Ta or Ru.

Each of the optional AFM layers formed adjacent to the first and second magnetic reference layers 58 and 64 may be made of any suitable anti-ferromagnetic material, such as but not limited to IrMn, PtMn, or FeRh.

FIGS. 4A and 4B illustrate the memory element 36 in the low and high resistance state, respectively. In the low resistance state as shown in FIG. 4A, the first variable magnetization direction 74' of the first magnetic free layer 60 is parallel to the first pseudo-fixed magnetization direction 78 of the first magnetic reference layer 58 and the second variable magnetization direction 76' of the second magnetic free layer 66 is also parallel to the second pseudo-fixed magnetization direction 80 of the second magnetic reference layer 64. As such, both MTJs 52 and 54 are in the low resistance state. In the high resistance state as shown in FIG. 4B, the first variable magnetization direction 74" of the first magnetic free layer 60 is anti-parallel or opposite to the first pseudo-fixed magnetization direction 78 of the first magnetic reference layer 58 and the second variable magnetization direction 76" of the second magnetic free layer 66 is also opposite to the second pseudo-fixed magnetization direction 80 of the second magnetic reference layer 64, rendering both MTJs 52 and 54 in the high resistance state. Because the first and second magnetic free layers 60 and 66 are anti-ferromagnetically coupled, the first and second variable magnetization directions 74 and 76 are opposite to each other, whether the memory element 36 is in the low or high resistance state.

Operation of the memory element 36 will now be described with reference to FIGS. 4A-4B, 5A-5D, and 6A-6D. Referring now to FIGS. 4A and 4B, in read operation, a read current is passed through the memory element 36 to measure the total voltage change across the two MTJs 52 and 54, thereby ascertaining the resistance state of the element 36.

FIGS. 5A-5D illustrate selected stages of the magnetization configuration for the memory element 36 as the resistance thereof is switched from low to high resistance state according to a method embodiment of the present invention. FIG. 5A shows the memory element 36 is initially in the low resistance state as the first and second variable magnetization directions 74' and 76' are parallel to the first and second pseudo-fixed magnetization directions 78 and 80, respectively. The switching process from the low to high resistance state begins by applying an electric potential across the MTJ memory element 36 such that the positive terminal is connected to one of the two contacts 70 and 72 that is coupled to one of the two MTJs 52 and 54 with a higher moment free layer. Therefore, in some embodiments where the first magnetic free layer 60 has a higher magnetic moment than the second magnetic free layer 66, the positive terminal is connected to the second contact 72 and the negative terminal is connected to the first contact 70 as illustrated in FIG. 5B. The applied electric potential causes electrons or negative charge to accumulate in an interface region of the first magnetic reference layer 58 adjacent to the first insulating tunnel junction layer 62, thereby tilting or rotating the first pseudo-fixed magnetization direction 78' of the first magnetic reference layer 58 away from the stable vertical position without flipping to the opposite direction. The electric potential may be applied across the memory element 36 by supplying suitable voltages to one of the bit lines 40 and one of the source lines 42 connected to the element 36.

As the first pseudo-fixed magnetization direction 78' tilts away from the stable vertical position 78, the perpendicular anisotropy and the coercivity field of the first magnetic reference layer 58 weaken, thereby allowing the opposite magnetic field exerted by the second magnetic reference layer 64 to flip the first variable magnetization direction 74' to the anti-parallel orientation 74" as illustrated in FIG. 5C. When the first variable magnetization direction flips from the parallel 74' to the anti-parallel 74" orientation, the second variable magnetization direction also flips from the parallel 76' to the anti-parallel orientation 76" because the first and second magnetic free layers 60 and 66 are anti-ferromagnetically coupled. The simultaneous switching of two anti-ferromagnetically coupled layers is sometime referred to as spin flip-flop. Accordingly, the first and second free magnetic layers 60 and 66 and the anti-ferromagnetic coupling layer 56 collectively behave as a composite free layer. In embodiments where the first magnetic free layer 60 has a higher magnetic moment than the second magnetic free layer 66, the switching behavior of the composite free layer will be dominated by the first magnetic free layer 60.

After the first and second variable magnetization directions have flipped to the anti-parallel orientations 74" and 76", respectively, the applied potential is removed, thereby allowing the first pseudo-fixed magnetization direction 78' to return to the stable vertical position 78 as shown in FIG. 5D. The memory element 36 is now in the high resistance state as the first and second variable magnetization directions 74" and 76" are anti-parallel to the first and second pseudo-fixed magnetization directions 78 and 80, respectively.

FIGS. 6A-6D illustrate selected stages of the magnetization configuration for the memory element 36 as the resistance thereof is switched from high to low resistance state according to another method embodiment of the present invention. FIG. 6A shows the memory element 36 is initially in the high resistance state as the first and second variable magnetization directions 74" and 76" are anti-parallel to the first and second pseudo-fixed magnetization directions 78 and 80, respectively. The switching process from the high to low resistance state begins by applying an electric potential across the MTJ memory element 36 such that the negative terminal is connected to one of the two contacts 70 and 72 that is coupled to one of the two MTJs 52 and 54 with a lower moment free layer, opposite to the process described above for switching from the low to high resistance state. Accordingly, in some embodiments where the first magnetic free layer 60 has a higher magnetic moment than the second magnetic free layer 66, the positive terminal is connected to the first contact 70 and the negative terminal is connected to the second contact 72 as illustrated in FIG. 6B. The applied electric potential causes electrons or negative charge to accumulate in an interface region of the second magnetic reference layer 64 adjacent to the second insulating tunnel junction layer 68, thereby tilting or rotating the second pseudo-fixed magnetization direction 80' of the second magnetic reference layer 64 away from the stable vertical position 80 without flipping to the opposite direction.

As the second pseudo-fixed magnetization direction 80' tilts away from the stable vertical position 80, the perpendicular anisotropy and the coercivity field of the second magnetic reference layer 64 weaken, thereby allowing the opposite magnetic field exerted by the first magnetic reference layer 58 to flip the first variable magnetization direction 74" to the parallel orientation 74' as illustrated in FIG. 6C. The second variable magnetization direction also flips from the anti-parallel 76" to the parallel orientation 76' by the spin flip-flop effect. After the first and second variable magnetization directions have flipped to the parallel orientations 74' and 76', respectively, the applied potential is removed, thereby allowing the second pseudo-fixed magnetization direction 80' to return to the stable vertical position 80 and rendering the memory element 36 in the low resistance state as shown in FIG. 6D.

Compared with the field-toggle MRAM, the MRAM device of the present invention does not need the extra write word line circuitry, thereby allowing the present device to have a smaller foot print. Unlike the spin transfer torque MRAM that requires a relatively large switching current to pass therethrough, the MRAM device of the present invention uses an electric potential rather than current to switch the resistance state, thereby alleviating the stringent requirement on the current-carrying capacity of the selection transistor. Moreover, the lower operating current of the present device would allow higher device resistance, which can be realized by increasing the thickness of the insulating tunnel junction barrier to improve TMR and reliability.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. For example, the stacking order of the layers of the memory element 36 illustrated in FIG. 3 may be inverted without affecting the device performance. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

What is claimed is:

1. A magnetic random access memory (MRAM) element comprising:
   a first magnetic tunnel junction (MTJ) including a first magnetic reference layer and a first magnetic free layer with a first insulating tunnel junction layer interposed therebetween, said first magnetic reference layer having a first pseudo-fixed magnetization direction substantially perpendicular to a layer plane thereof, said first magnetic free layer having a first variable magnetization direction substantially perpendicular to a layer plane thereof;
   a second MTJ including a second magnetic reference layer and a second magnetic free layer with a second insulating tunnel junction layer interposed therebetween, said second magnetic reference layer having a second pseudo-fixed magnetization direction that is substantially perpendicular to a layer plane thereof and is substantially opposite to said first pseudo-fixed magnetization direction, said second magnetic free layer having a second variable magnetization direction that is substantially perpendicular to a layer plane thereof and is substantially opposite to said first variable magnetization direction; and
   an anti-ferromagnetic coupling layer that couples said first and second magnetic free layers to each other.

2. The MRAM element of claim 1, wherein said first magnetic free layer has a first magnetic moment, said second magnetic free layer has a second magnetic moment substantially smaller than said first magnetic moment.

3. The MRAM element of claim 1, further comprising a first contact formed adjacent to said first magnetic reference layer opposite said first insulating tunnel junction layer and a second contact formed adjacent to said second magnetic reference layer opposite said second insulating tunnel junction layer.

4. The MRAM element of claim 1, wherein said first and second magnetic free layers each is made of an alloy comprising cobalt, iron, and boron.

5. The MRAM element of claim 1, wherein said first and second magnetic free layers each comprises two magnetic sublayers with a tantalum sublayer interposed therebetween.

6. The MRAM element of claim 1, wherein said first and second magnetic reference layers each is made of an alloy comprising cobalt, iron, and boron.

7. The MRAM element of claim 1, wherein said first and second magnetic reference layers each has a multilayer structure formed by interleaving two different types of materials with at least one of said two different types of materials being magnetic.

8. The MRAM element of claim 1, wherein said anti-ferromagnetic coupling layer is made of ruthenium or tantalum.

9. The MRAM element of claim 1, wherein each of said first and second insulating tunnel junction layers is made of magnesium oxide or aluminum oxide.

10. The MRAM element of claim 1, wherein each of said first and second insulating tunnel junction layers has an RA value in the range of about 20 to 2000 $\Omega \cdot \mu m^2$.

11. The MRAM element of claim 1, further comprising a first anti-ferromagnetic layer formed adjacent to said first magnetic reference layer opposite said first insulating tunnel junction layer.

12. The MRAM element of claim 11, further comprising a second anti-ferromagnetic layer formed adjacent to said second magnetic reference layer opposite said second insulating tunnel junction layer.

13. The MRAM element of claim 1, wherein said first magnetic reference layer has a first pseudo-fixed magnetization direction substantially perpendicular to a layer plane thereof, said second magnetic reference layer has a second pseudo-fixed magnetization direction that is substantially perpendicular to a layer plane thereof and is substantially opposite to said first pseudo-fixed magnetization direction, said first magnetic free layer has a first variable magnetization direction substantially perpendicular to a layer plane thereof, said second magnetic free layer has a second variable magnetization direction that is substantially perpendicular to a layer plane thereof and is substantially opposite to said first variable magnetization direction, said first magnetic free layer has a first magnetic moment, said second magnetic layer has a second magnetic moment substantially smaller than said first magnetic moment.

14. The MRAM element of claim 13, further comprising a first contact formed adjacent to said first magnetic reference layer opposite said first insulating tunnel junction layer and a second contact formed adjacent to said second magnetic reference layer opposite said second insulating tunnel junction layer.

15. A method for switching the MRAM element of claim 14 from low to high resistance state, comprising the steps of:
   applying an electric potential with a positive terminal electrically connected to said second contact and a negative terminal electrically connected to said first contact; and
   removing said electric potential.

16. A method for switching the MRAM element of claim 14 from high to low resistance state, comprising the steps of:
   applying an electric potential with a positive terminal electrically connected to said first contact and a negative terminal electrically connected to said second contact; and
   removing said electric potential.

* * * * *